(12) United States Patent  
Visokay et al.

(10) Patent No.: US 7,018,902 B2
(45) Date of Patent: Mar. 28, 2006

(54) GATE DIELECTRIC AND METHOD (75) Inventors: Mark R. Visokay, Richardson, TX (US); Antonio L. P. Rotondaro, Dallas, TX (US); Luigi Colombo, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 491 days.

(21) Appl. No.: 10/165,888

(22) Filed: Jun. 10, 2002

(65) Prior Publication Data

US 2003/0104710 A1 Jun. 5, 2003

Related U.S. Application Data (60) Provisional application No. 60/334,459, filed on Nov. 30, 2001.

(51) Int. Cl.
*H01L 21/00* (2006.01)
(52) U.S. Cl. .................................... 438/287; 438/785
(58) Field of Classification Search ............... 438/240, 438/253, 346, 3, 392, 511, 795, 287, 785; 257/759, 774
See application file for complete search history.

(56) References Cited

U.S. PATENT DOCUMENTS

| 4,844,775 | A | * | 7/1989 | Keeble ........................ 216/68 |
| 5,552,337 | A | * | 9/1996 | Kwon et al. ................ 438/396 |
| 6,225,122 | B1 | * | 5/2001 | Sah et al. .................... 435/467 |
| 6,348,373 | B1 | * | 2/2002 | Ma et al. ..................... 438/240 |
| 6,429,497 | B1 | * | 8/2002 | Nickel ......................... 257/421 |
| 6,458,695 | B1 | * | 10/2002 | Lin et al. ..................... 438/659 |
| 6,475,854 | B1 | * | 11/2002 | Narwankar et al. ......... 438/238 |
| 6,509,200 | B1 | * | 1/2003 | Koyanagi ..................... 438/14 |
| 6,514,828 | B1 | * | 2/2003 | Ahn et al. ................... 438/297 |
| 6,525,427 | B1 | * | 2/2003 | Duncombe et al. ......... 257/759 |
| 6,544,906 | B1 | * | 4/2003 | Rotondaro et al. ......... 438/785 |
| 6,573,193 | B1 | * | 6/2003 | Yu et al. ..................... 438/770 |
| 6,607,993 | B1 | * | 8/2003 | Dickinson et al. .......... 438/795 |
| 2001/0013660 | A1 | * | 8/2001 | Duncombe et al. ......... 257/760 |

* cited by examiner

*Primary Examiner*—Richard A. Booth
(74) *Attorney, Agent, or Firm*—Carlton H. Hoel; W. James Brady; Frederick J. Telecky, Jr.

(57) ABSTRACT

A MOSFET structure with high-k gate dielectric layer and silicon or metal gates, amorphizing treatment of the high-k gate dielectric layer as with a plasma or ion implantation.

8 Claims, 9 Drawing Sheets

GATE DIELECTRIC AND METHOD

RELATED APPLICATIONS

The following patent applications disclose related subject matter: Ser. No. 60/334,459, filed Nov. 30, 2001. These applications have a common assignee with the present application.

BACKGROUND OF THE INVENTION

The invention relates to electronic semiconductor devices, and, more particularly, to gate structures and fabrication methods for integrated circuits.

The trend in semiconductor integrated circuits to higher device densities by down-scaling structure sizes and operating voltages has led to silicon field effect (MOS) transistor gate dielectrics, typically made of silicon dioxide, to approach thicknesses on the order of 1–2 nm to maintain the capacitive coupling of the gate to the channel. However, such thin oxides present leakage current problems due to carrier tunneling through the oxide. Consequently, alternative gate dielectrics with greater dielectric constants to permit greater physical thicknesses have been proposed. Indeed, $Ta_2O_5$, $(Ba,Sr)TiO_3$, and other high dielectric constant materials have been suggested, but such materials have poor interface stability with silicon.

Wilk and Wallace, Electrical Properties of Hafnium Silicate Gate Dielectrics Deposited Directly on Silicon, 74 Appl. Phys. Lett. 2854 (1999), disclose measurements on capacitors with a hafnium silicate dielectric formed by sputtering deposition (at a pressure of $5 \times 10^{-6}$ mTorr and substrate temperature of 500° C.) of a 5 nm thick $Hf_6Si_{29}O_{65}$ ($Hf_{0.18}Si_{0.89}O_2$) layer directly onto silicon together with a gold top electrode deposition on the silicate dielectric. Such capacitors showed low leakage current, thermal stability, an effective dielectric constant of about 11, and a breakdown field of 10 MV/cm.

However, with high volume production of silicon integrated circuits such high-k gate dielectrics have problems such as control of leakage currents.

SUMMARY OF THE INVENTION

The present invention provides integrated circuit fabrication with a high-k gate dielectric amorphization treatment.

This has advantages including deterrence of dielectric crystallization and thereby enhancement of leakage current suppression.

BRIEF DESCRIPTION OF THE DRAWINGS

The drawings are heuristic for clarity.

DESCRIPTION OF THE PREFERRED EMBODIMENTS

1. Overview

Preferred embodiment integrated circuits and MOS transistors include amorphized metal high-k gate dielectrics. Preferred embodiment fabrication methods include amorphization treatments of a high-k gate dielectric prior to deposition of gate material.

2. Silicon Gate With High-k Gate Dielectric Preferred Embodiments

FIGS. 1a–1h illustrate in cross sectional elevation views steps of first preferred embodiment fabrication methods for integrated circuits including field effect transistors (e.g., CMOS or BiCMOS) with high-k gate dielectrics. The preferred embodiments include the following steps:

(1) Substrate

Figure 1A:
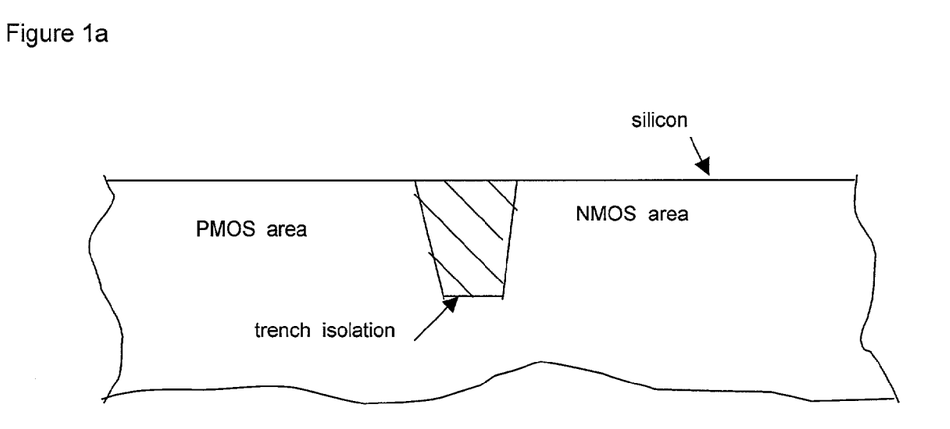
FIGS. 1a–1h are cross sectional elevation views of steps of a preferred embodiment integrated circuit fabrication method.

Start with a p-type silicon (or silicon-on-insulator) wafer with <100> orientation and form shallow trench isolation by pad oxide growth, nitride deposition, trench pattern, nitride-oxide-silicon trench etch, trench surface oxidation, trench fill by blanket APCVD oxide deposition, etch-CMP planarization, and nitride strip. FIG. 1a is a cross-sectional elevation view of the substrate illustrating the trench isolation and locations for fabrication of NMOS and PMOS transistors.

Figure 1B:
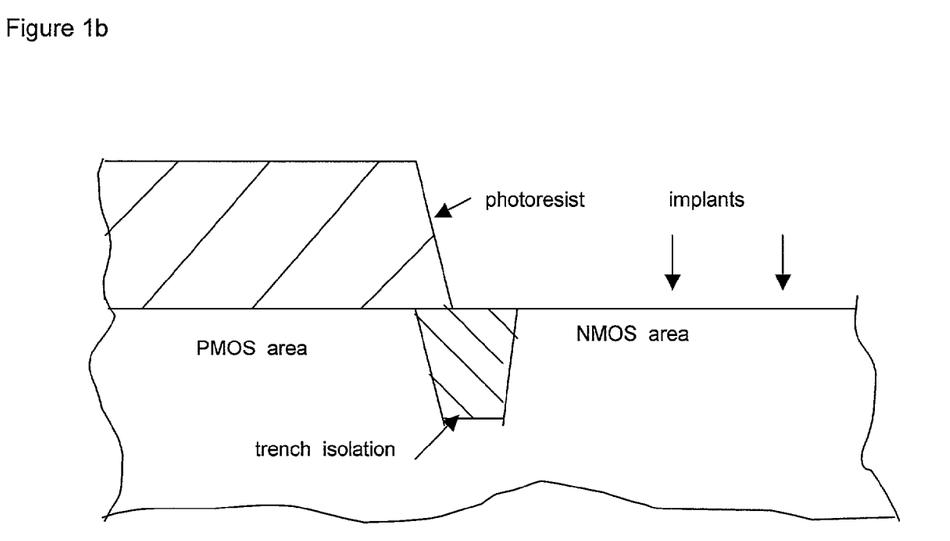

Next, perform multiple dopant implants to form n- and p-type wells (plus, optionally, memory cell array wells and bipolar device buried layers) plus form channel stop regions, punchthrough deterrence regions, and threshold adjust regions. These implants are performed through any residual pad oxide after the nitride strip. FIG. 1b illustrating the masked NMOS transistor location implants; a similar masked implant occurs in the PMOS locations. Note that the implant doses and depths may differ for memory cell array transistors as compared to peripheral transistors. Also, both high and low voltage transistors of the same type may be formed and may have different implant doses and depths. A rapid thermal anneal (e.g., 1050° C. for 30 s) activates and diffuses the implanted dopants (e.g., boron and phosphorus).

(2) High-K Gate Dielectric Deposition

Figure 1C:
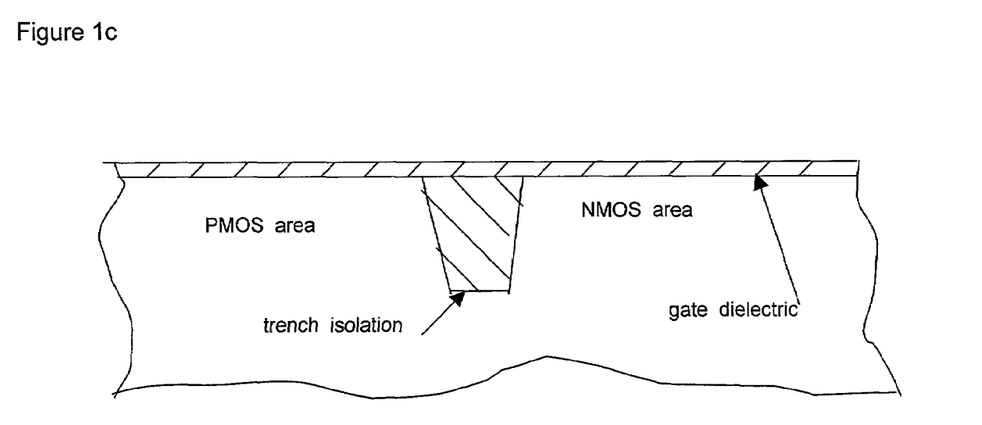

Deposit high-k gate dielectric material, i.e. $Hf_{0.55}Si_{0.45}O_2$, by CVD, ALD or PVD to a thickness of from about 3 nm to about 7 nm as illustrated in FIG. 1c. The high-k gate dielectric has an effective dielectric constant higher than 4, so the 7 nm thick high-k may have an equivalent silicon dioxide thickness of 2 nm or less but not the leakage (tunneling) current of such a thin silicon dioxide gate dielectric.

Figure 4:
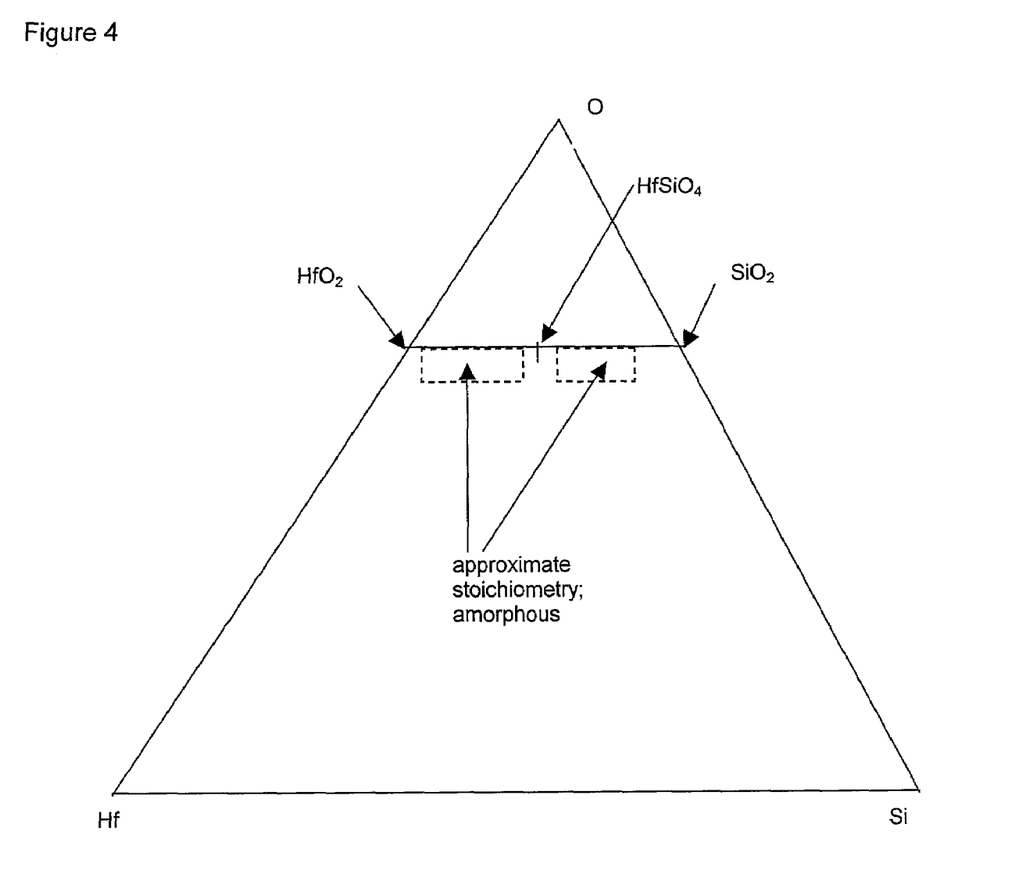
FIG. 4 is a composition diagram.

The exact composition of the gate dielectric can be varied by adjusting the deposition conditions. FIG. 4 is a Gibbs diagram showing useful gate dielectric compositions made of Hf, Si, and O. The composition regions indicated by broken and solid line boundaries (which include oxygen deficient high-k compounds) avoid the $HfO_2$ and $HfSiO_4$ stoichiometric compositions which are likely to be easily crystallizable. Nitrided versions would start with oxygen-deficient regions in FIG. 4.

Also, zirconium analogs such as $Zr_xSi_{1-x}O_2$ have similar behavior but with lower dielectric constants than the corresponding hafnium compositions.

(3) High-K Gate Dielectric Amorphization

Figure 1D:
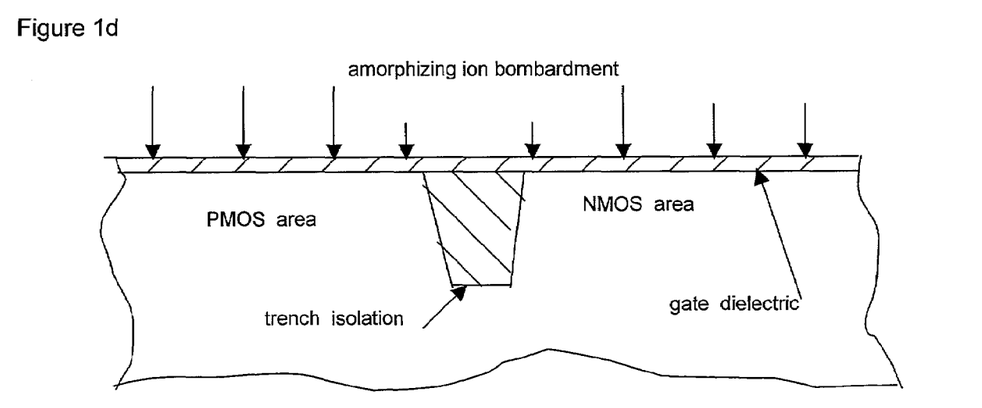

The high-k gate dielectric layer deposited in step (2) may crystallize at fairly low temperatures. Indeed, CVD at 500–600° C. may yield partially crystalline or nanocrystalline high-k, and such structures continue to crystallize during subsequent processing more readily than if the starting structure is amorphous. Even if the structures are not nanocrystalline as-deposited, they may have subcritical nuclei which can easily nucleate into crystalline grains during elevated temperature processing. The preferred embodiments avoid such growth or nucleation of crystalline material by an amorphization with ion bombardment from a high-bias plasma or low-energy ion implantation as illustrated in FIG. 1d. In particular, a first amorphization treatment excites Ar into a plasma adjacent the high-k-coated substrate at a low pressure such as 1 Pa (7.5 mTorr) and with a plasma bias (voltage from substrate to plasma) of 500–700 volts. The Ar ions from the plasma bombarding the high-k dielectric layer damage crystal structure in the high-k material up to depths of roughly 3–4 nm but only sputter away a minimal amount of high-k material. An ion dose of roughly $10^{14}$ ions/cm$^2$ suffices.

An alternative implants Ar ions at very low ion energy, such as 2–3 keV; this ensures significant penetration to 7 nm and should amorphize the entire high-k dielectric layer.

Alternative plasma or ion implantation treatments for the high-k dielectric layer add chemical effects to the amorphization effects. In particular, excite $O_2$ (or even $O_3$ or $N_2O$) into a plasma adjacent the high-k dielectric layer at a low pressure such as 1 Pa (7.5 mTorr) and with a plasma bias (voltage from substrate to plasma) of 500–700 volts. Ions such as $O_2^+$ and $O^+$ from the plasma bombarding the high-k dielectric layer damage the crystal structure in the high-k material and also may fill any O vacancies in the high-k; material and thereby improve the stoichiometry of the high-k material. Similarly, ion implantation of oxygen species at very low energies in the range of 3–4 keV amorphizes and oxygenates. Also, CVD materials typically have incorporated carbon due to the organic precursors used. In this case the oxygen introduced into the high-k dielectric layer may also eliminate residual carbon by conversion to CO or $CO_2$ gas which escapes. Note that oxidizing anneals to eliminate such carbon may have the side effect of growing $SiO_2$ at the interface of the silicon substrate with the high-k dielectric layer; such silicon dioxide growth would degrade the overall dielectric constant.

Another alternative plasma or ion implantation treatment for the high-k dielectric layer also adds chemical effects to the amorphization effects. Indeed, excite $N_2$ into a plasma adjacent the high-k dielectric layer at a low pressure such as 2 Pa (15 mtorr) and with a plasma bias of 300 volts. Ions such as $N_2^+$ from the plasma bombarding the high-k dielectric layer damage crystal structure in the high-k material and also may fill any O vacancies in the high-k material forming nitrides; thus the stoichiometry of the high-k material may be modified to oxynitrides such as $Hf_xSi_{1-x}O_{2-y}N_y$. Similarly, ion implantation with N ions at very low energies (e.g., 3–4 keV) amorphizes and nitrides the high-k dielectric layer.

Alternative amorphization treatments for the high-k layer include ion implantation with Si ions at energies in the range 3–4 keV. This amorphizes and may help the stoichiometry for Si-poor high-ks.

When the bombarding ions may adversely affect the underlying silicon, preferred embodiments limit the energy of the bombarding ions so the projected range into the high-k dielectric layer is less than one half of the thickness of the high-k dielectric layer. In this case the amorphicity of the high-k material at the interface with the gate (to be deposited in the next step) will be greater than the amorphicity of the high-k material at the interface with the underlying silicon.

(4) Gate Material Deposition

Figure 1E:
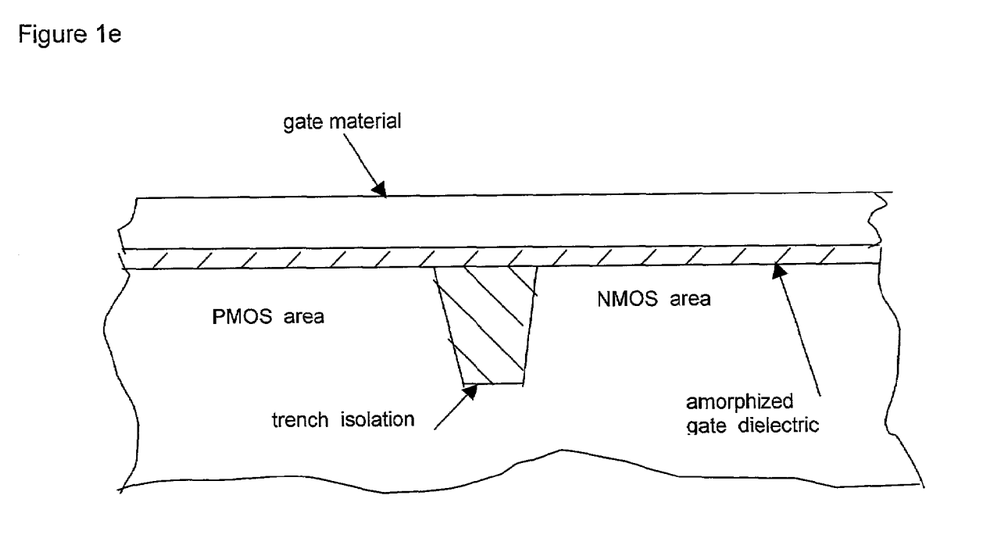
Figure 1F:
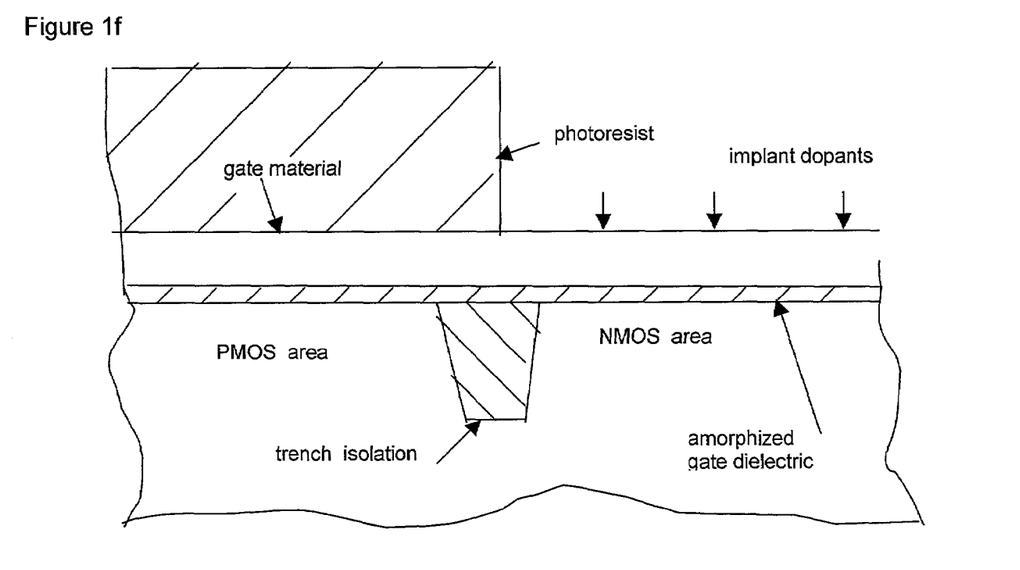

Deposit a layer of amorphous silicon (or polysilicon) gate material of thickness 100 nm on the treated high-k gate dielectric layer; see FIG. 1e. The deposition may be low temperature decomposition of silane. Then dope the gate material n-type and p-type in the NMOS and PMOS areas, respectively, by non-critical photoresist masking and dopant implantations. (Polysilicon emitters for npn bipolars would be in the n-type area.)

(5) Gate Mask and Etch

Spin on a layer of photoresist which is sensitive to deep ultraviolet; optionally, an antireflective coating (ARC) layer could be deposited prior to the photoresist in order to limit interference effects during photoresist exposure. The composition of the ARC and thickness are selected according to the exposure wavelength and the reflectivity of the underlying material. Expose the photoresist through a reticle for gates and gate level interconnects; the exposed minimal linewidth may be about 50 nm. Lastly, develop the photoresist and strip exposed ARC, if any.

Figure 1G:
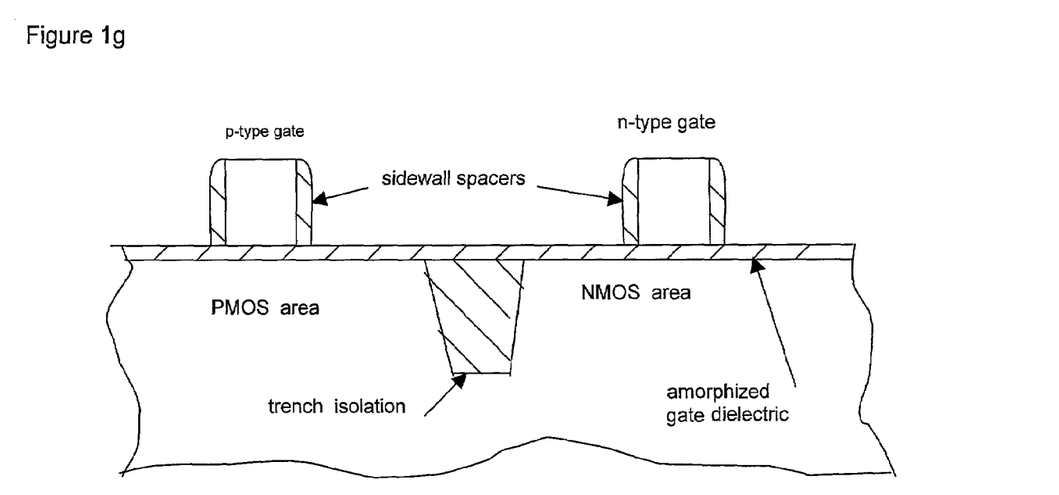

Use the patterned photoresist as an etch mask for the anisotropic plasma etch of the gate material (amorphous silicon or polysilicon) to form gates and gate level interconnects and any bipolar emitters. The etch may be a two (or more) step process with an initial fast etch (such as a fluorine-based etchant source) followed by an HBr plus $O_2$ etchant source which is very selective to high-k material. If the polysilicon etch erodes the photoresist, the underlying ARC layer provides sufficient etch masking. Gates are 100 nm high and 50 nm long (FIG. 1g is a cross section along the gate length, and gates typically have widths much greater than their lengths).

Next, form sidewall spacers on the gates (and gate level interconnects) by a blanket conformal deposition of spacer material (such as 20 nm of silicon nitride or silicon dioxide) followed by anisotropic etch back to remove the spacer material from horizontal surfaces. FIG. 1g illustrates the resulting sidewall spacers.

Implant dopants to form source/drain regions using the gates plus sidewall spacers as self-aligning masks; this also adds further dopants to the gates. As before, use a non-critical mask on the NMOS regions during PMOS source/drains implant and a non-critical mask on the PMOS regions during NMOS source/drains implant. The implants can be through the exposed high-k gate material over the source/drain regions, or the exposed high-k gate material can first be etched off. For lightly-doped drains, use first implants after gate formation but prior to sidewall spacer formation.

(6) Interlevel Dielectric and Contacts

Figure 1H:
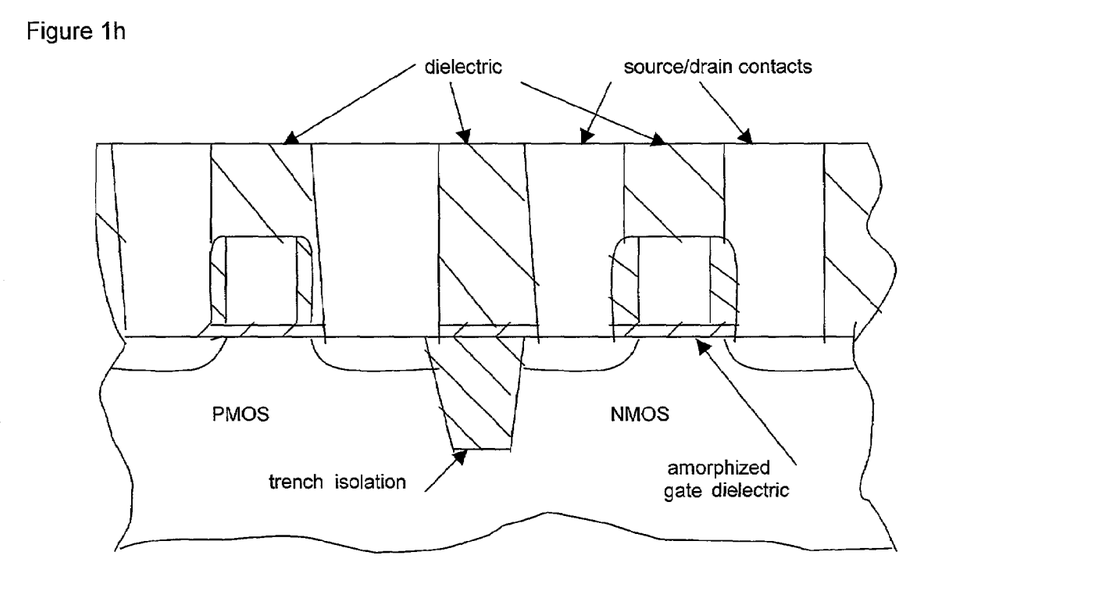

FIG. 1h illustrates subsequent structure after deposition of a first interlevel dielectric and formation of contacts to source/drains. The integrated circuit fabrication continues with further levels of dielectrics and interconnects.

3. Metal and Silicide Gate Materials

Figure 2:
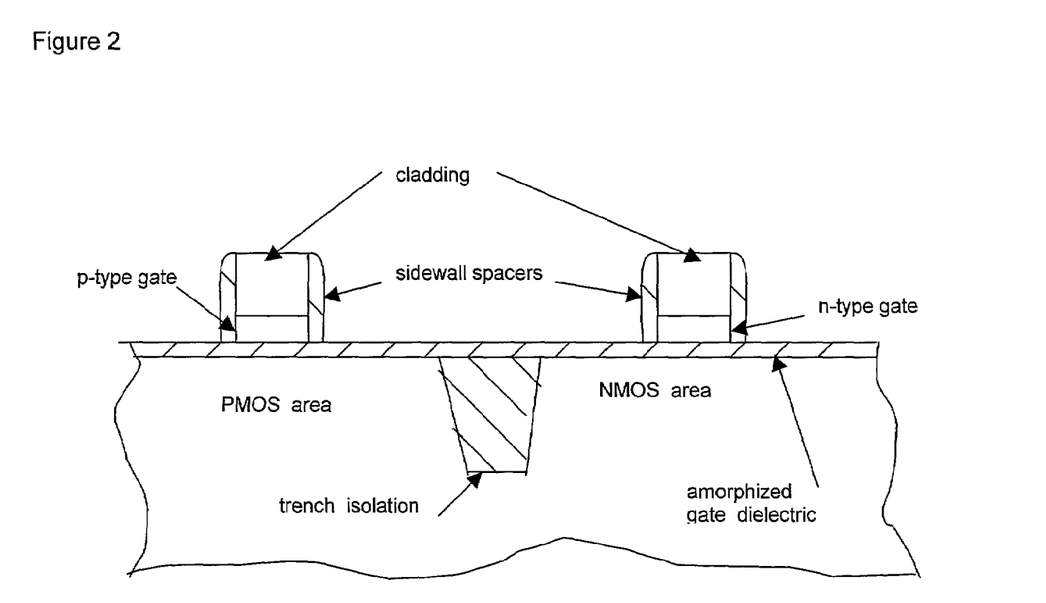
FIG. 2 shows an alternative preferred embodiment.

The gate material deposited in step (4) could be metal or metal silicide, and could be two different materials with work functions appropriate for NMOS and PMOS devices, such as Ti and Mo or $TaSi_2$ and $Pd_2Si$. Further, the gates (including silicon gates) could be clad with a metal or metal silicide to increase conductivity; see FIG. 2.

4. Disposable Gate Preferred Embodiments

Figure 3A:
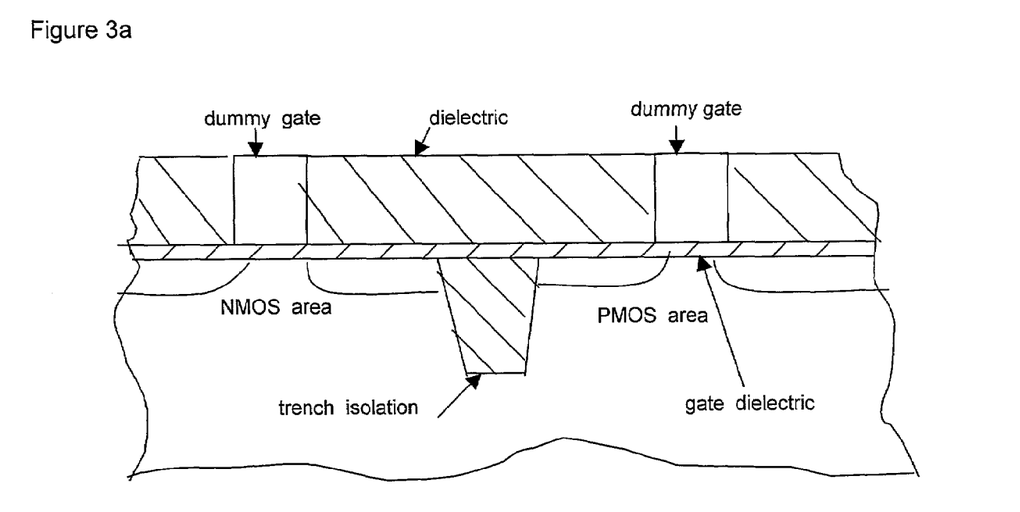
FIGS. 3a–3c illustrate another preferred embodiment.
Figure 3B:
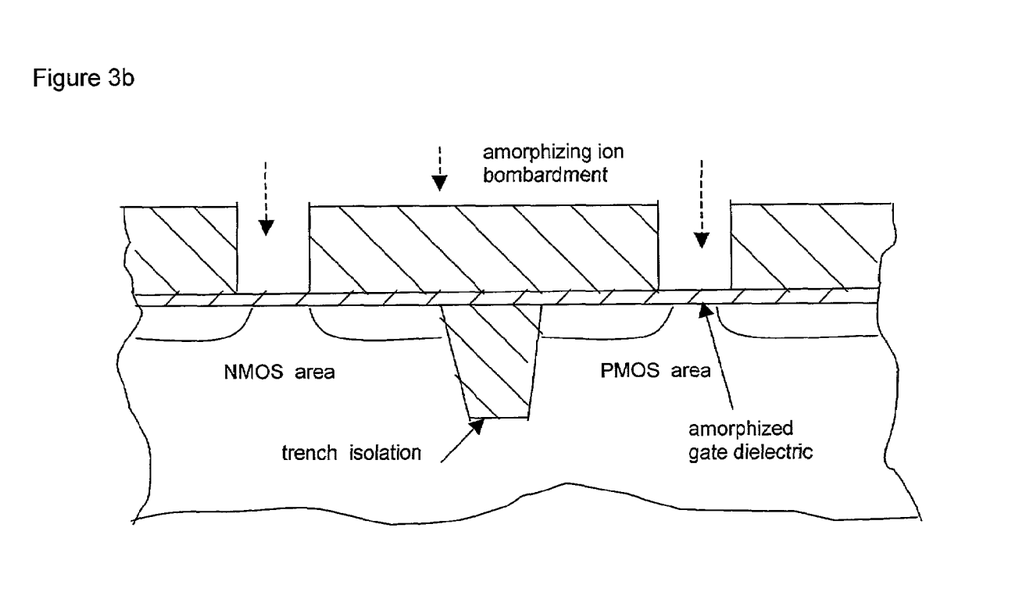
Figure 3C:
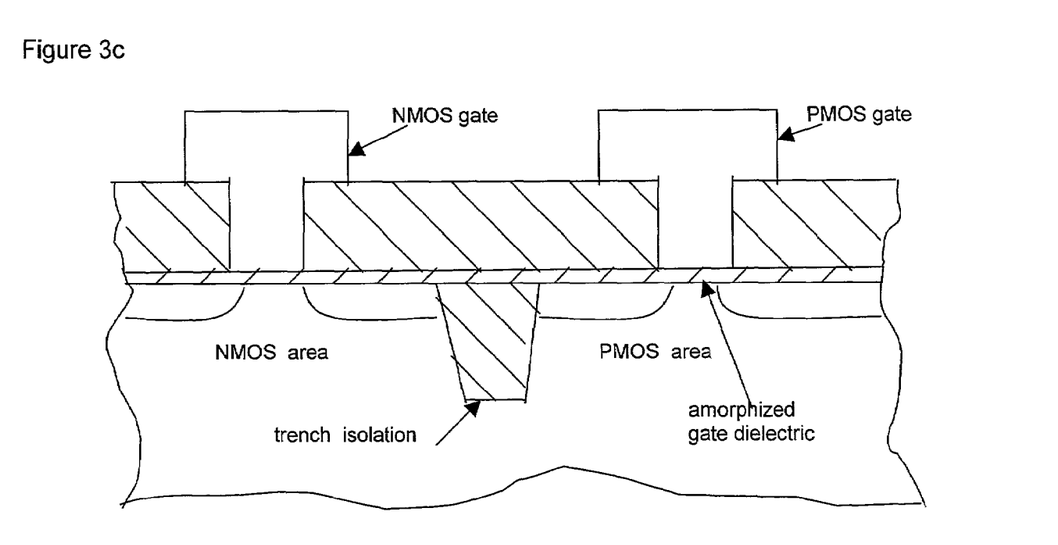

FIGS. 3a–3c illustrate a preferred embodiment disposable gate method of integrated circuit fabrication which uses a preferred embodiment high-k gate dielectric amorphization. In particular, follow the steps (1)–(5) of the foregoing preferred embodiment to have a polysilicon dummy gate with sidewall spacers and source/drains formed in the substrate. The high-k gate dielectric layer may have been amorphized as in step (3) or the amorphization may be deferred until after removal of the dummy gates or may be performed at both times.

Deposit 200-nm-thick dielectric, such as TEOS oxide, and planarize the resulting structure, such as by CMP, to expose the top of the polysilicon dummy gate. FIG. 3a shows dummy gate and dielectric; a dummy gate may be about 200 nm high and 50 nm long.

Etch out the dummy gates with an HBr+$O_2$ plasma which stops on the high-k gate dielectric layer. Optionally, strip the gate dielectric and deposit a new 7 nm thick high-k gate dielectric layer at the bottom of the groove left by the removal of dummy gate; this also deposits roughly 7 nm of high-k on the sidewalls to shorten the eventual gate to 35–40 nm. Of course, if the original gate dielectric layer is removed at the bottoms of the grooves, then the original gate dielectric layer could be any convenient dielectric material, such as silicon dioxide. Then perform a preferred embodiment amorphizing ion bombardment of the high-k gate dielectric layer as illustrated in FIG. 3b; this may be omitted if the treatment had previously been performed on the high-k gate dielectric layer prior to dummy gate material deposition.

Next, blanket deposit a gate material, such as one of the foregoing different metals, alloys, silicides, etc. to fill the groove plus cover the planarized dielectric; the gate material may be 100 nm thick. Note for the case of silicide gates, the dummy silicon gates need only be partially removed and metal may be deposited directly on the remaining dummy gate and then reacted with the dummy gate to form the silicide. To form different silicide gates for NMOS and PMOS deposit a first metal, next, pattern and etch to remove the first metal from NMOS (PMOS) areas, and then deposit a second metal and silicide.

Spin on and pattern photoresist to define a gate top of length 250 nm, and use the patterned photoresist to etch gate material to form T-shaped gate; see FIG. 3c.

Continue as in foregoing to form interlevel dielectrics and interconnects.

5. Modifications

The preferred embodiments can be modified in various ways while retaining the feature of amorphizing a high-k gate dielectric layer.

For example, the NMOS and PMOS gates may be of differing materials by processes such as a deposition of a first gate material, partial removal, and then deposition of a second gate material. The metal high-k could be $Hf_xSi_yO_z$ with $0.1<x<0.4$, $0.6<y<0.9$, and $1.2<z<2.6$ or $0.6<x<0.9$, $0.1<y<0.4$, and $1.2<z<2.6$.

What is claimed is:

1. A method of fabrication of an integrated circuit, comprising the steps of:
   providing a substrate;
   forming a high-k dielectric layer on said substrate;
   amorphizing said dielectric layer by ion bombardment;
   forming gate material on said amorphized dielectric layer; and
   forming gates from said gate material.

2. The method of claim 1, wherein:
   said high-k dielectric layer includes a metal silicate.

3. The method of claim 1, wherein:
   said ion bombardment of step (c) of claim 1 is exposure to a plasma.

4. The method of claim 1, wherein:
   said ion bombardment of step (c) of claim 1 includes oxygen-based ions.

5. The method of claim 1, wherein:
   said ion bombardment of step (c) of claim 1 has ions with a projected range of less than one half the thickness of said dielectric layer.

6. The method of claim 1, wherein:
   said ion bombardment of step (c) of claim 1 is ion implantation.

7. The method of claim 1, further comprising
   prior to said forming gate material of step (d) of claim 1, forming dummy gates on said dielectric layer and removing said dummy gates.

8. The method of claim 1, wherein:
   said gate material has a first composition in an NMOS area and a second composition in a PMOS area.

* * * * *